United States Patent
Kang

(10) Patent No.: US 7,327,614 B2
(45) Date of Patent: Feb. 5, 2008

(54) MEMORY DEVICE WITH PROGRAMMABLE PARAMETER CONTROLLER

(75) Inventor: Hee Bok Kang, Daejeon (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/512,381

(22) Filed: Aug. 30, 2006

(65) Prior Publication Data

US 2006/0285379 A1 Dec. 21, 2006

Related U.S. Application Data

(62) Division of application No. 10/626,775, filed on Jul. 25, 2003, now Pat. No. 7,120,041.

(30) Foreign Application Priority Data

Dec. 18, 2002 (KR) .......................... 10-2002-81102

(51) Int. Cl.
*G11C 7/10* (2006.01)

(52) U.S. Cl. ........................... 365/189.05; 365/230.06; 365/230.08

(58) Field of Classification Search ........... 365/189.01, 365/189.05 O, 189.08, 189.11, 194, 230.01, 365/230.06 X, 230.08 X, 230.06, 230.08, 365/189.05
See application file for complete search history.

(56) References Cited

U.S. PATENT DOCUMENTS

| | | | |
|---|---|---|---|
| 4,873,664 A | 10/1989 | Eaton, Jr. | |
| 5,848,026 A | 12/1998 | Ramamurthy et al. | |
| 5,917,758 A * | 6/1999 | Keeth .................... | 365/189.05 |
| 5,937,424 A | 8/1999 | Leak et al. | |
| 5,999,483 A | 12/1999 | Itou | |
| 6,148,360 A | 11/2000 | Leak et al. | |
| 6,226,200 B1 | 5/2001 | Eguchi et al. | |
| 6,424,593 B1 | 7/2002 | Kuge et al. | |
| 6,484,278 B1 | 11/2002 | Merritt et al. | |
| 6,614,695 B2 | 9/2003 | Keays | |
| 6,707,757 B2 | 3/2004 | Roohparvar | |
| 6,894,547 B2 * | 5/2005 | Takahashi .................... | 327/170 |
| 2004/0047172 A1 | 3/2004 | Komatsuzaki | |

FOREIGN PATENT DOCUMENTS

DE 101 26 312 A1 12/2002

\* cited by examiner

*Primary Examiner*—VanThu Nguyen
(74) *Attorney, Agent, or Firm*—Townsend and Townsend and Crew LLP

(57) ABSTRACT

A memory device having the capability of controlling a characteristic parameter including a register controller including a nonvolatile memory unit for storing data and a parameter controller for outputting a signal corresponding to a predetermined input signal. The parameter controller controls one or more characteristic parameters of the memory unit, including input voltage sensitivity, output signal delay and output signal voltage, according to a signal outputted from the register controller.

7 Claims, 19 Drawing Sheets

MEMORY DEVICE WITH PROGRAMMABLE PARAMETER CONTROLLER

CORRESPONDING RELATED APPLICATION

This application is a divisional of U.S. application Ser. No. 10/626,775 filed Jul. 25, 2003, now U.S. Pat. No. 7,120,041 which claims priority to Korean Patent Application No. 10-2002-81102 filed Dec. 18, 2002, which are hereby incorporated by reference in their entirety.

BACKGROUND OF THE INVENTION

1. Field of the Invention

The present invention relates to memory devices, and more particularly to a memory device including a parameter controlling device for regulating characteristic parameters of the memory device such as a voltage level of an input signal, a timing characteristic, and a voltage level of an output signal, by using a programmable method.

2. Description of the Prior Art

During the development of a memory device, signal performance characteristics, which are characteristic parameters of a circuit such as a voltage level of a signal inputted in a chip, a timing characteristic (e.g., signal delay), and a voltage level of a signal outputted from the chip, are necessarily re-adjusted within a simulation error range.

The production of the conventional memory device is commenced only after amending the masks to apply or achieve the adjusted parameters. As a result, the production of a device using a new mask requires extra time and cost to establish the device's characteristic parameters or signal performance characteristics.

SUMMARY OF THE INVENTION

It is therefore an object of the present invention to easily regulate characteristic parameters without physically amending the masks by using programmable registers.

There is provided a memory device including a parameter controlling device, comprising: a register controller including a nonvolatile memory unit for storing data in the nonvolatile memory unit; and a parameter controller for outputting a signal having characteristics depending on a signal outputted from the register controller.

DETAILED DESCRIPTION OF THE PREFERRED EMBODIMENTS

The present invention will be described in more detail with reference to the accompanied drawings.

Figure 1:
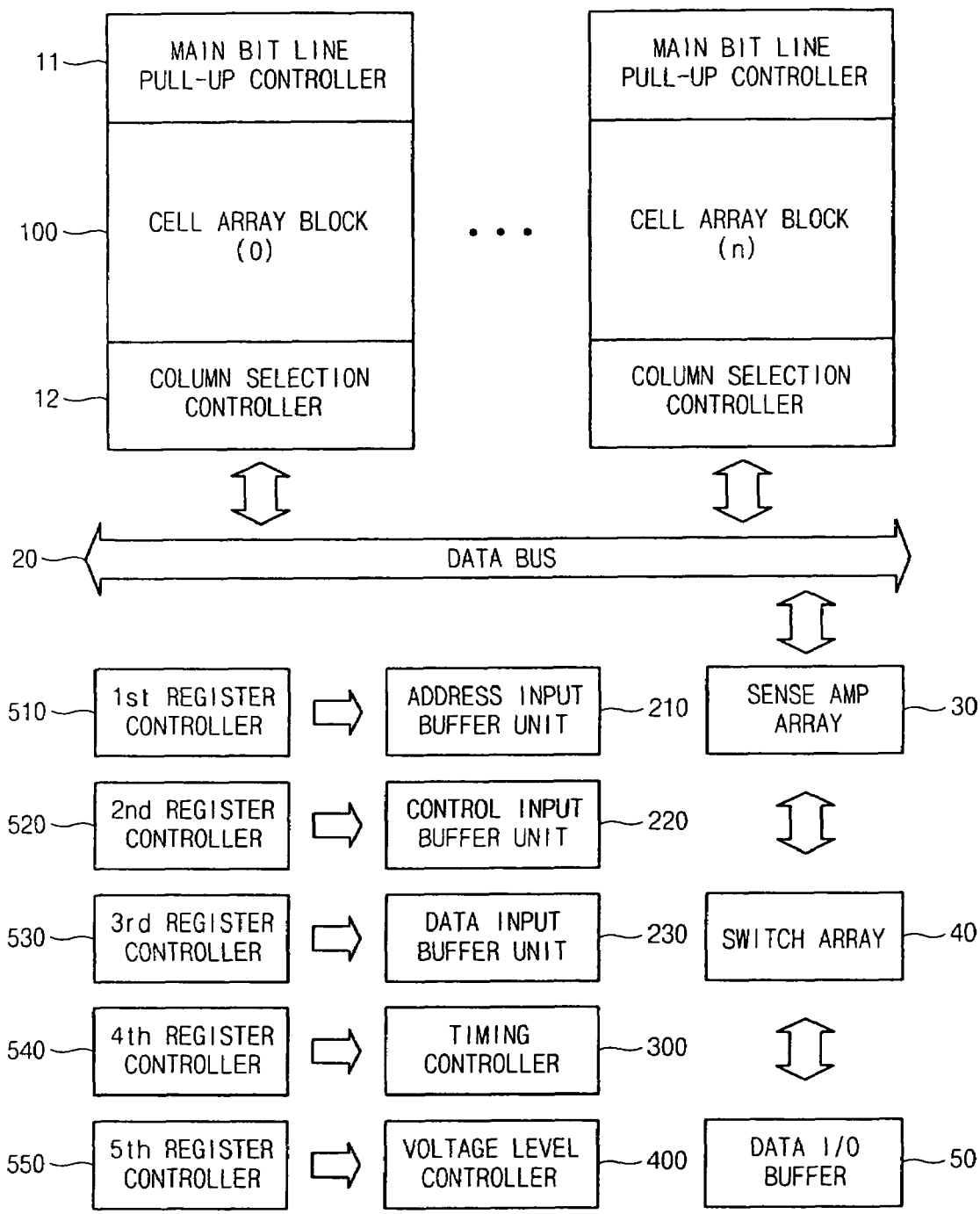
FIG. 1 is a block diagram showing a structure of a memory device according to an embodiment of the present invention.

FIG. 1 is a block diagram showing a structure of a ferroelectric memory device including a parameter controlling device according to an embodiment of the present invention. The memory device in this embodiment comprises a cell array block 100, a main bitline pull-up controller 11, a column selection controller 12, a sense amplifier array 30, a data I/O buffer 50, a switch controller 40, a first register controller 510, a second register controller 520, a third register controller 530, a fourth register controller 540 and a fifth register controller 550. The main bitline pull-up controller 11 pulls up a main bitline included in the cell array block 100 to a positive voltage. The column selection controller 12 connects the main bitline to a data bus 21. The sense amplifier array 30 is connected to the data bus 21. The data I/O buffer 50 exchanges data externally. The switch controller 40 is connected between the sense amplifier array 30 and the data I/O buffer 50. The first register controller 510 controls an address input buffer unit 210. The second register controller 520 controls a control input buffer unit 220. The third register controller 530 controls a data input buffer unit 230. The fourth register controller 540 controls a timing controller 300. The fifth register controller 550 controls a voltage level controller 400.

Figure 2:
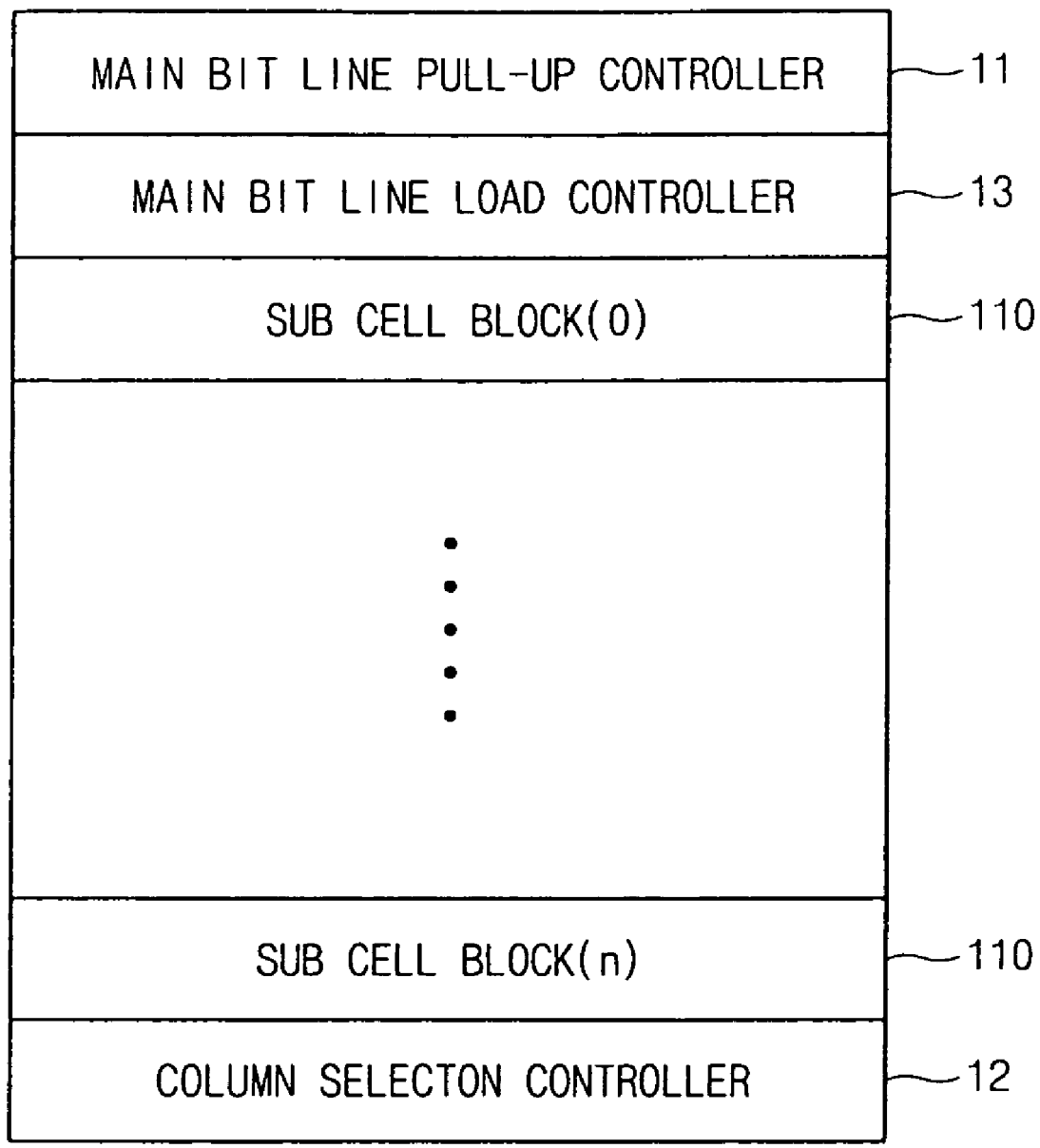
FIG. 2 is a block diagram showing a main bitline pull-up controller, a cell array block and a column selection controller of FIG. 1.

FIG. 2 is a block diagram showing a main bitline pull-up controller 11, a cell array block 100 and a column selection controller 12 of FIG. 1. The cell array block 100 includes a plurality of main bitline load controllers 13 and a plurality of sub cell blocks 110. There may be one or more main bitline load controllers 13.

Figure 3:
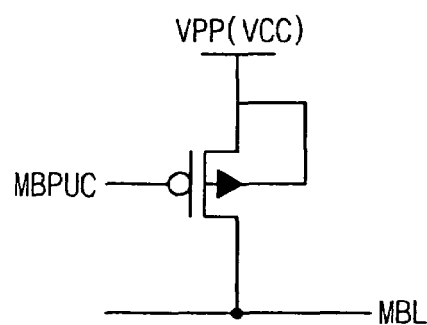
FIG. 3 is a detailed structural diagram showing the main bitline pull-up controller of FIG. 1.

FIG. 3 is a detailed structural diagram showing the main bitline pull-up controller 11 of FIG. 1. The main bitline pull-up controller 11 comprises a PMOS transistor having a gate to receive a control signal MBPUC, a source connected to a power source VPP(VCC) and a drain connected to a main bitline MBL.

The main bitline pull-up controller 11 pulls up the main bitline MBL in a precharge operation.

Figure 4:
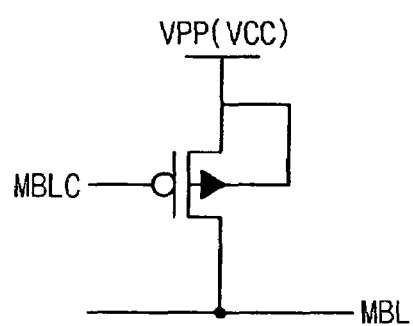
FIG. 4 is a detailed structural diagram showing a main bitline load controller of FIG. 2.

FIG. 4 is a detailed structural diagram showing the main bitline load controller 13 of FIG. 2. The main bitline load controller 13 comprises a PMOS transistor having a gate to receive a control signal MBLC, a source connected to the power source VPP(VCC) and a drain connected to the main bitline MBL.

The main bitline load controller 13, working as a resistive device connected between the power source VPP(VCC) and the main bitline MBL, determines a voltage of the main bitline MBL according to the amount of current flowing through the main bitline load controller 13 during a data sensing operation.

One or more main bitline load controllers 13 are connected to one main bitline MBL (see FIG. 1). When two or more main bitline load controllers 13 are connected, the same number of sub cell blocks 110 are assigned to a main bitline load controller 13, and the main bitline controllers 13 may be evenly (approximately) placed apart from each other.

Figure 5:
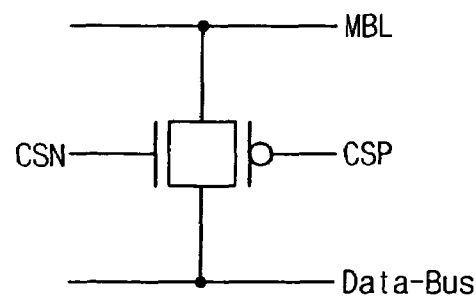
FIG. 5 is a detailed structural diagram showing the column selection controller of FIG. 1.

FIG. 5 is a detailed structural diagram showing the column selection controller 12 of FIG. 1. The column selection controller 12 is a switch for connecting the main bitline MBL and the data bus that is turned on/off by control signals CSN and CSP.

Figure 6:
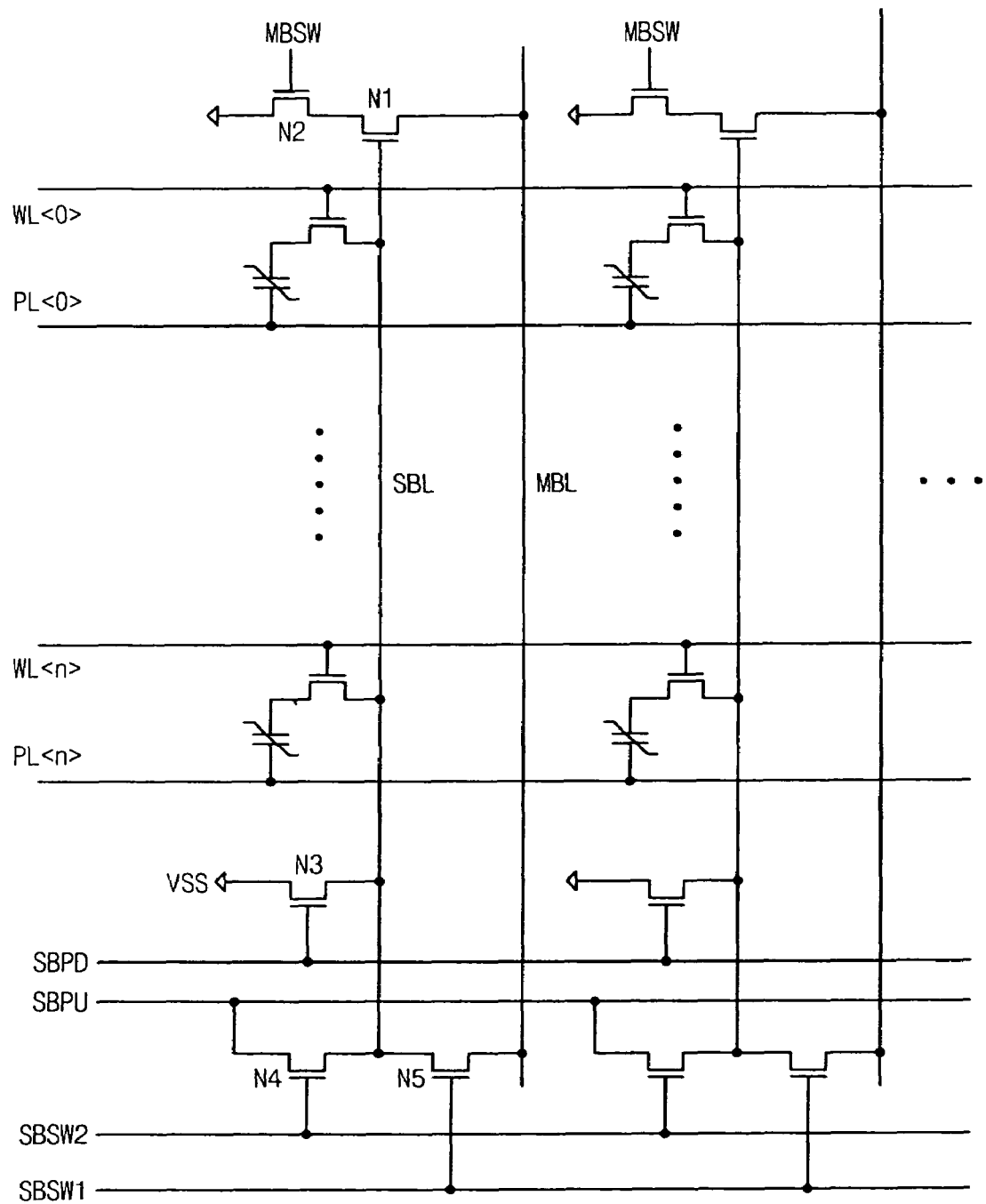
FIG. 6 is a detailed structural diagram showing a sub-cell block of FIG. 2.

FIG. 6 is a detailed structural diagram showing the sub cell block 110 of FIG. 2. One sub cell block comprises a sub bitline SBL, and NMOS transistors N1, N2, N3, N4 and N5. The sub bitline SBL is connected in common to a plurality of unit cells connected to a number (n) of wordlines WL<n> and a number (n) of platelines PL<n>, respectively. The NMOS transistor N1 for regulating a current has a gate connected to a first terminal of the sub bitline SBL, and a drain connected to a main bitline MBL. The NMOS transistor N2 has a gate connected to a control signal MBSW, a drain connected to a source of the NMOS transistor N1, and a source connected to ground. The NMOS transistor N3 has a gate connected to a control signal SBPD, a drain connected to a second terminal of the sub bitline SBL, and a source connected to ground. The NMOS transistor N4 has a gate connected to a control signal SBSW2, a source connected to a second terminal of the sub bitline SBL, and a drain connected to a control signal SBPU. The NMOS transistor N5 has a gate connected to a control signal SBSW1, a drain connected to the main bitline MBL, and a source connected to the second terminal of the sub bitline SBL.

When a unit cell is accessed, the sub bitline SBL connected to the corresponding unit cell is connected to the main bitline MBL. The sub bitline SBL is connected to the main bitline MBL via the NMOS transistor N5. As a result, the amount of load for driving a bitline decreases to that corresponding to one sub bitline.

If a SBPD signal is activated, a potential of the sub bitline SBL is regulated to ground level. The SBPU signal regulates a power voltage to be supplied to the sub bitline SBL. The control signal SBSW1 controls a signal flow between the main bitline MBL and the sub bitline SBL. The control signal SBSW2 controls a signal flow between the signal SBPU and the sub bitline SBL.

The sub bitline SBL connected to the gate to the NMOS transistor N1 regulates a sensing voltage of the main bitline MBL. The main bitline MBL is connected to the power source VPP(VCC) via the main bitline load controller 13 (illustrated in FIGS. 2 and 4). If a control signal MBSW is "high", a current flows from the power source VPP(VCC) via the main bitline MBL and the NMOS transistors N1 and N2 to the ground. Here, the amount of the current is determined by a voltage of the sub bitline SBL provided to the gate of the NMOS transistor N1. If the datum stored in the cell is "1", the amount of the current increases, and the voltage of the main bitline MBL decreases. If the datum stored in the cell is "0", the amount of the current decreases, and the voltage of the main bitline MBL increases. Thus, the cell datum can be detected by comparing the voltage of the main bitline MBL with a reference voltage. The detection of the cell datum is performed in the sense amplifier array 30.

Figure 7:
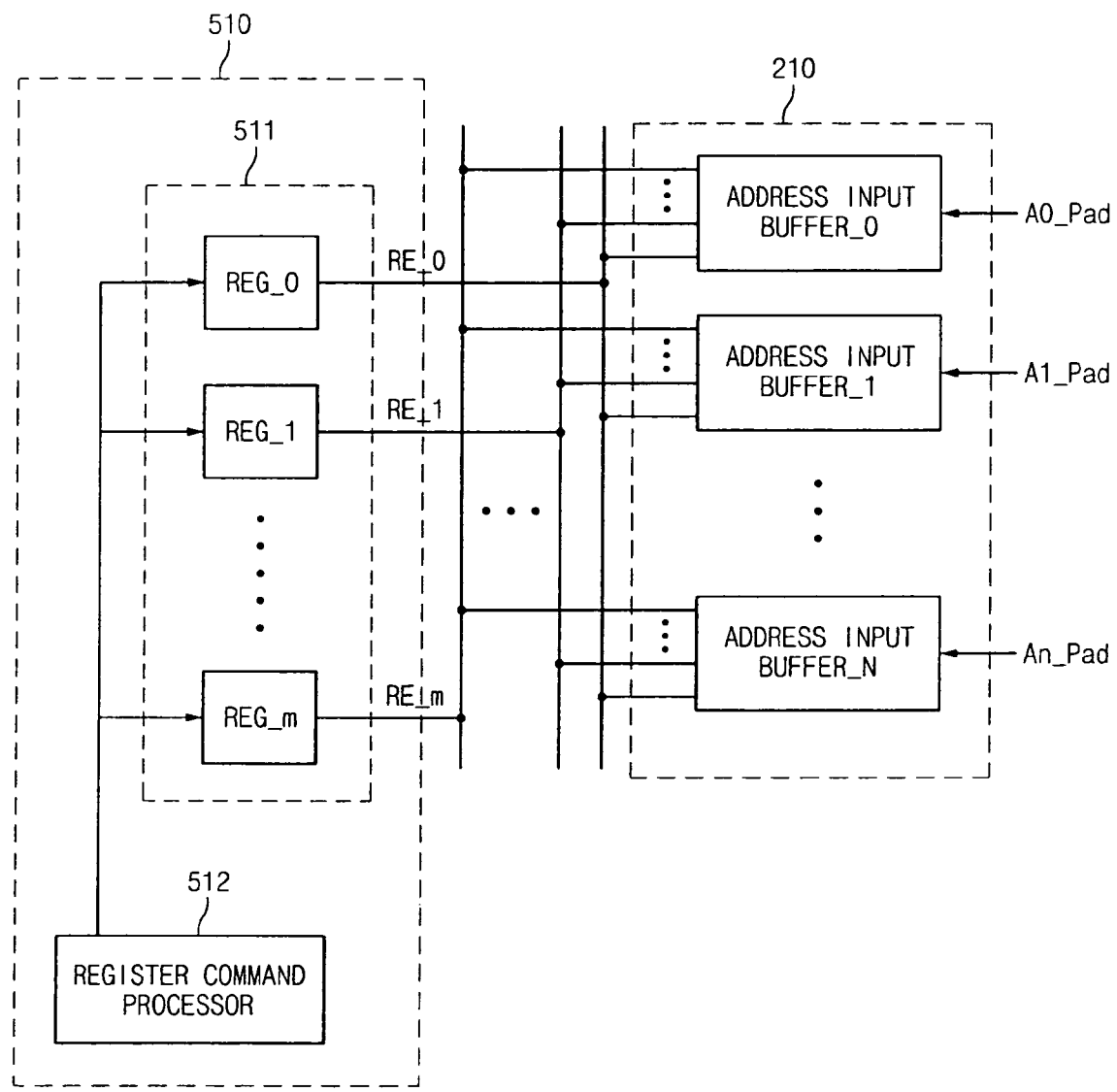
FIG. 7 is a structural diagram showing a first register controller and an address input buffer unit of FIG. 1.

FIG. 7 is a structural diagram showing the address input buffer unit 210 and the first register controller 510 of FIG. 1.

The address input buffer unit 210 comprises a plurality of address input buffers (address input buffer_0 . . . address input buffer_n), each of which is connected to a plurality of address pads A0_Pad, A1_Pad, . . . An_Pad. The first register controller 510 comprises a register array 511 including a plurality of registers REG_0, . . . REG_m, and a register command processor 512 for controlling the registers. Each address input buffer receives signals RE_0, RE_1, . . . RE_m outputted from the register array 511. The structures of the register command processor 512 and each register REG_0, REG_1, . . . REG_m will be explained in detail in FIG. 13.

Figure 8A:
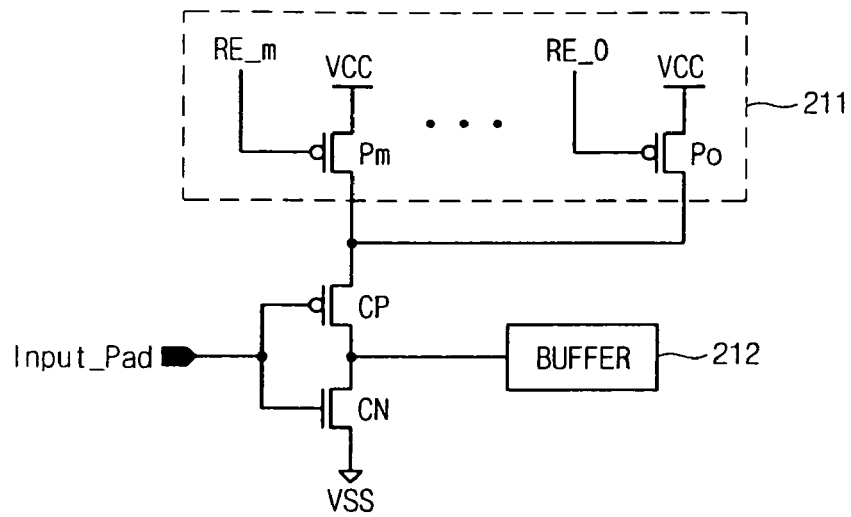
FIGS. 8a through 8c are detailed structural diagrams showing an address input buffer of FIG. 7.

FIG. 8a is a first example embodiment of each address input buffer included in the address input buffer 210. Each address input buffer comprises a current controller 211, a PMOS transistor CP, a NMOS transistor CN, and a BUFFER 212. The current controller 211 comprises a plurality of PMOS transistors $P_0, \ldots P_m$ having gates to receive output signals RE_0, . . . RE_m from the registers of the register array 511 and sources connected to power source VCC. The PMOS transistor CP has a source connected to drains of the PMOS transistors $P_0, \ldots P_m$. The NMOS transistor CN has a drain connected to a drain of the PMOS transistor CP. The BUFFER 212 is connected to the drain of the NMOS transistor CN. An address input pad Input_Pad is connected to a gate of the PMOS transistor CP and the NMOS transistor CN.

The amount of a current provided to a source of the PMOS transistor CP varies according to the number of turned-on transistors among the PMOS transistors $P_0, \ldots P_m$. As a result, a detection level of a signal provided to the address input pad Input_Pad can be adjusted. Thus, this embodiment comprises a detection level characteristic parameter controller that controls the input signal sensitivity by activating a number of registers in register array 511 via register command processor 512.

Figure 8B:
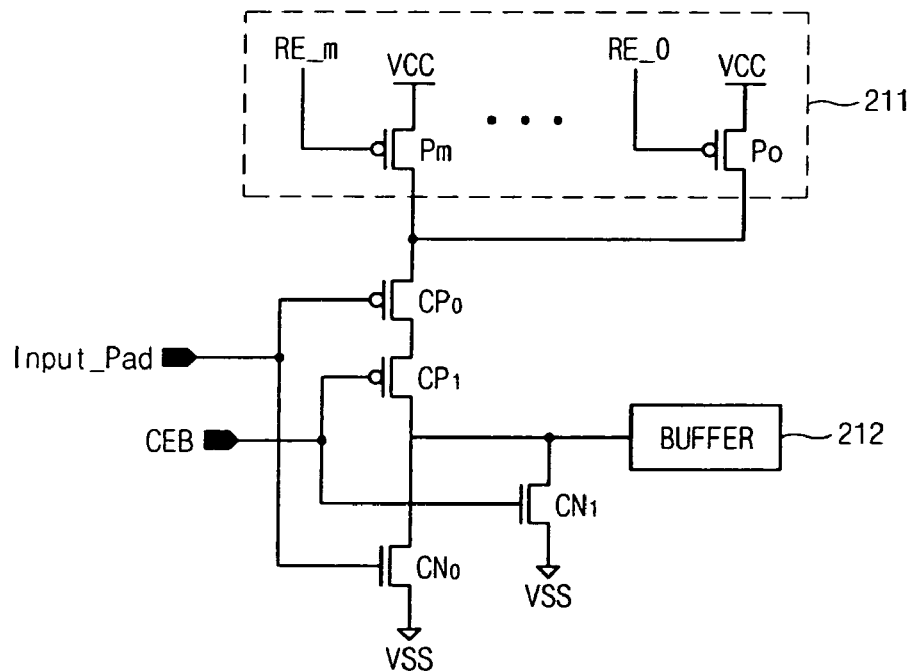

FIG. 8b is a second example embodiment of each address input buffer included in the address input buffer 210. In the second example embodiment, a capability for controlling activation in response to the chip enable signal CEB is added to the first example embodiment of FIG. 8a. A PMOS transistor $CP_0$ corresponds to the PMOS transistor CP of FIG. 8a, and a NMOS transistor $CN_0$ corresponds to the NMOS transistor CN of FIG. 8a. In the second example embodiment, a PMOS transistor $CP_1$ and a NMOS transistor $CN_1$ are added. The PMOS transistor $CP_1$ is connected between the PMOS transistor $CP_0$ and the NMOS transistor $CN_0$. The NMOS transistor $CN_1$ is connected between a drain of the NMOS transistor $CN_0$ and ground. The chip enable signal CEB is connected to a gate of the PMOS transistor $CP_1$ and the NMOS transistor $CN_1$. Thus, this embodiment comprises a detection level characteristic parameter controller that controls the input signal sensitivity by activating a number of registers in the register array 511 via the register command processor 512.

If the chip enable signal CEB is activated to "high", the NMOS transistor $CN_1$ is turned on. As a result, a "low" level signal is provided to the BUFFER 212 regardless of a signal of the address input pad Input_Pad. If the chip enable signal CEB is activated to "low", the PMOS transistor $CP_1$ is turned on, and the rest of the circuit operation is similar to that described for the example embodiment of FIG. 8a. Similarly, this embodiment comprises a detection level characteristic parameter controller that controls the input signal sensitivity by activating a number of registers in the register array 511 via the register command processor 512.

Figure 8C:
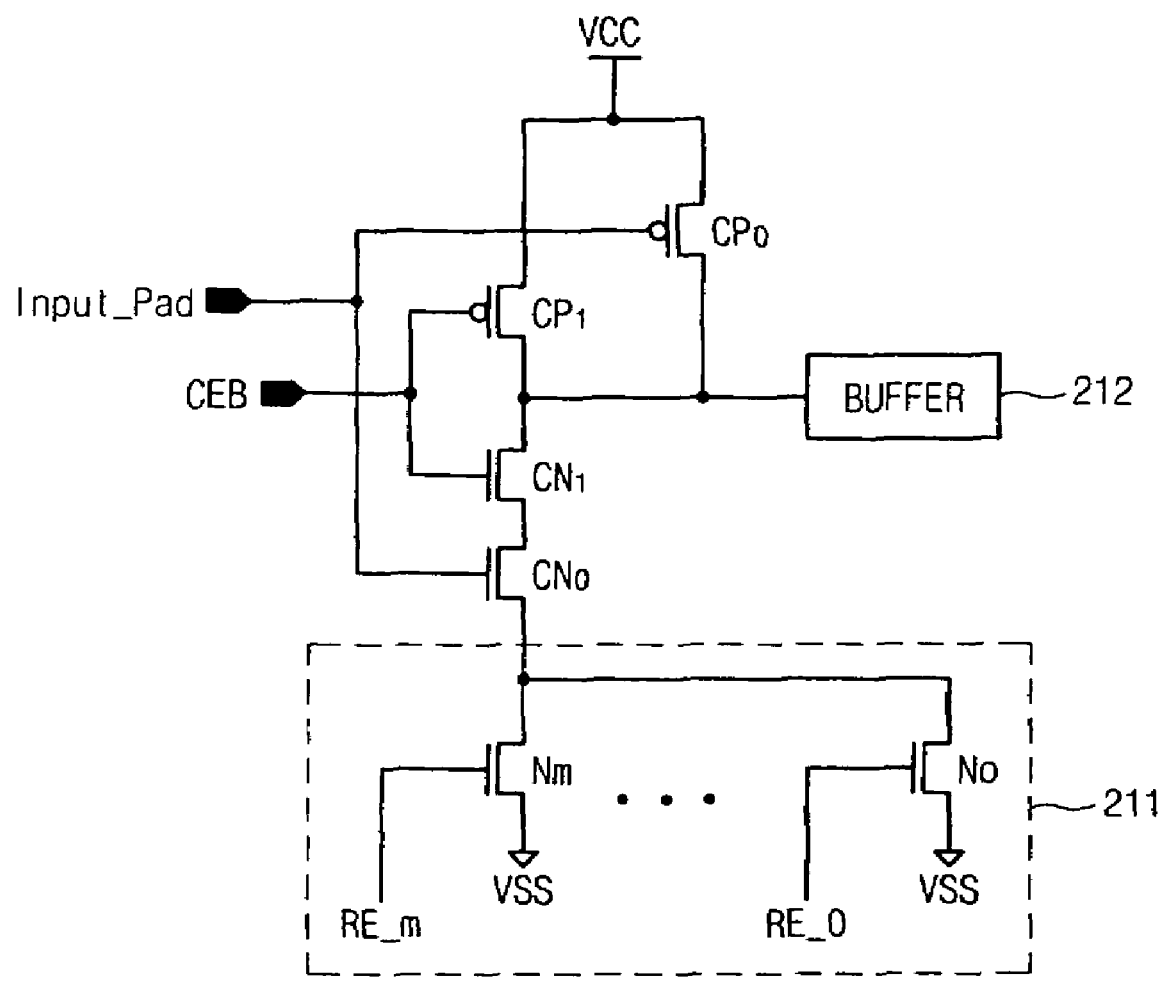

FIG. 8c is a third example embodiment of each address input buffer included in the address input buffer 210. The current controller 211 of the third example comprises a plurality of NMOS transistors $N_0, \ldots N_m$. NMOS transistors $N_0, \ldots N_m$ has gates connected to output signals RE_0, ... RE_m of registers, and sources connected to a power source VSS.

In this example embodiment, address input pad Input_Pad is inputted to a gate of the PMOS transistor $CP_0$ and to a gate of the NMOS transistor $CN_0$. The chip enable signal CEB is inputted to a gate of the PMOS transistor $CP_1$ and to a gate of the NMOS transistor $CN_1$.

The PMOS transistor $CP_0$ has a source connected to the power source VCC. The NMOS transistor $CN_0$ has a source connected to drains of the NMOS transistor $N_0, \ldots N_m$. The PMOS transistor $CP_1$ is connected in parallel to the PMOS transistor $CP_0$. The NMOS transistor $CN_1$ has a source connected to a drain of the NMOS transistor $CN_0$, and a drain connected to a drain of the PMOS transistor $CP_1$. The BUFFER 212 is connected to a drain of the PMOS transistor $CP_0$. The detailed explanation on the operation of the third example embodiment is omitted because it is similar to that of the second example embodiment of FIG. 8b. Similarly, this embodiment comprises a detection level characteristic parameter controller that controls the input signal sensitivity by activating a number of registers in the register array 511 via the register command processor 512.

Explanations of structures of the control input buffer unit 220 and the second register controller 520, and structures of the data input buffer unit 230 and the third register controller 530 of FIG. 1 are omitted because these structures are similar to those of the address input buffer unit 210 of FIG. 7 and the first register controller 510 of FIGS. 8a through 8c.

Figure 9:
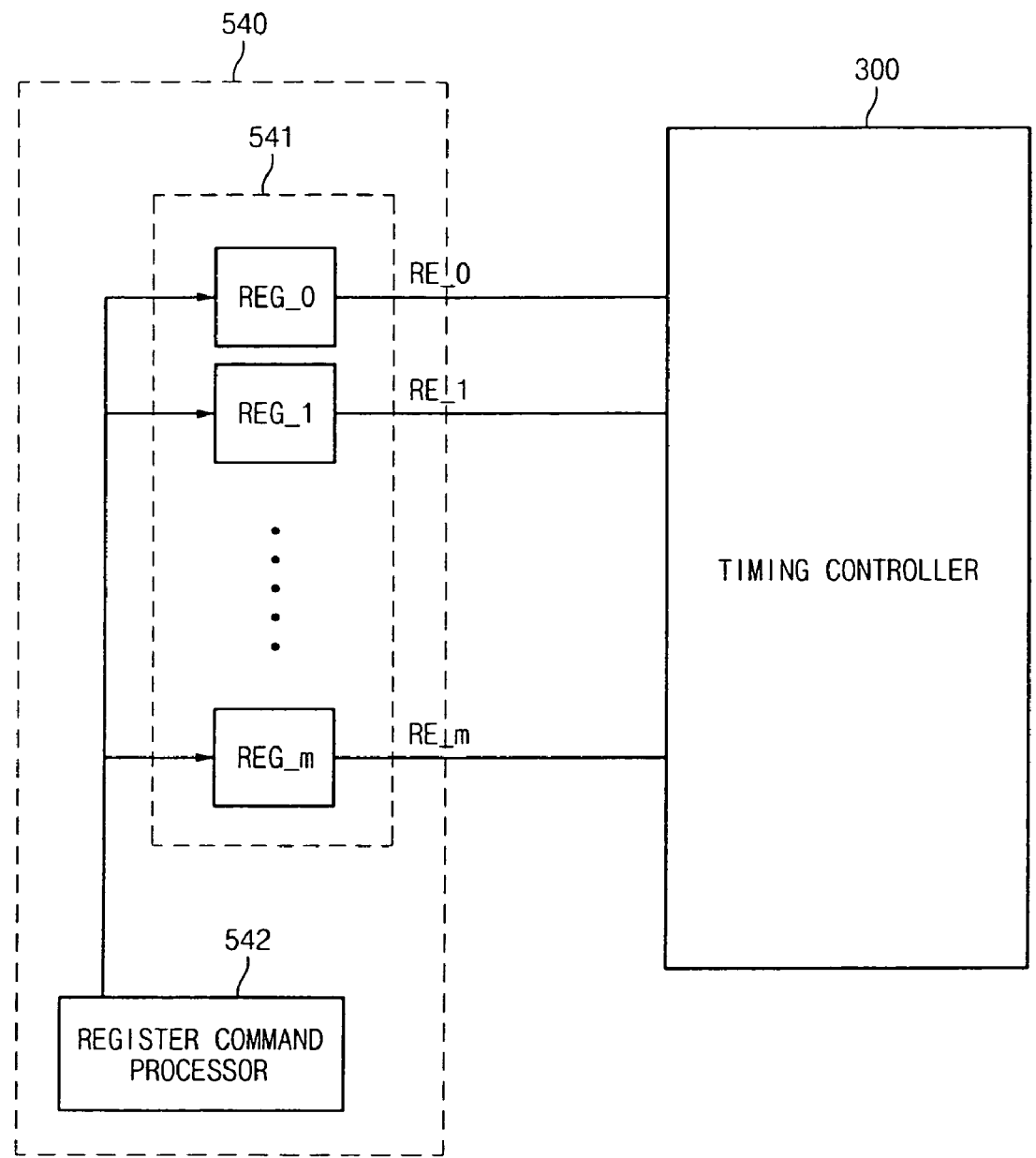
FIG. 9 is a structural diagram showing a fourth register controller and a timing controller of FIG. 1.

FIG. 9 is a structural diagram showing the timing controller 300 and the fourth register controller 540 of FIG. 1, which includes register array 541 and register command processor 542. The detailed explanation on the fourth register controller 540 is omitted because it has the same structure as the first register controller 510.

Figure 10A:
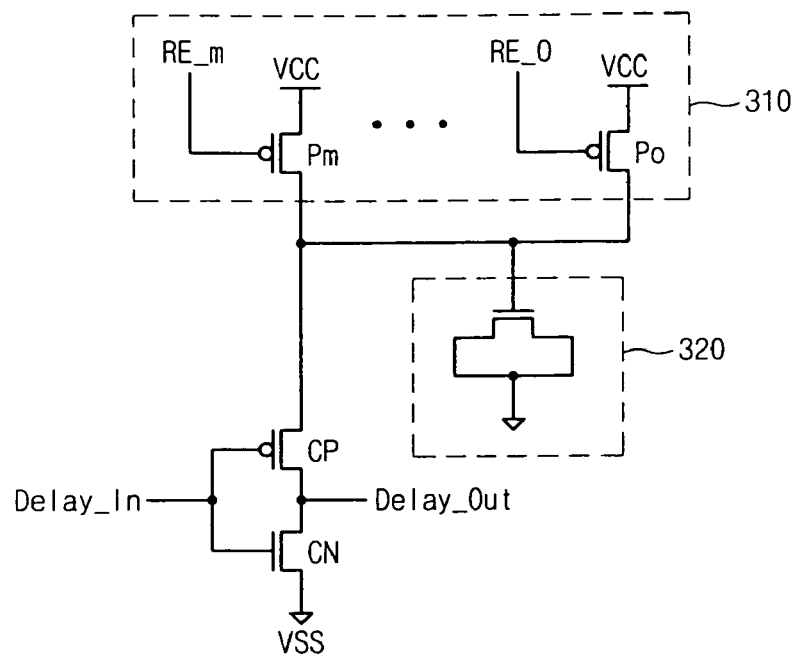
FIGS. 10a through 10b are structural diagrams of the timing controller of FIG. 9.

FIG. 10a shows a first example embodiment of the timing controller 300. The timing controller 300 comprises a current controller 310, a PMOS transistor CP, a NMOS transistor CN and a delay capacitor 320. The current controller 310 comprises a plurality of PMOS transistors $P_0, \ldots P_m$ having gates to receive outputs RE_0, ... RE_m and sources connected to the power source VCC. The PMOS transistor CP has a source connected to drains of the PMOS transistors $P_0, \ldots, P_m$. The NMOS transistor CN has a drain connected to a drain of the PMOS transistor CP. The delay capacitor 320 is connected between the source of the PMOS transistor CP and ground. An input signal Delay_In provided to a gate of the PMOS transistor CP and the NMOS transistor CN is delayed for a predetermined time and outputted at the drain of the PMOS transistor CP with its level inverted.

The delay time is regulated by the current controller 310 and the delay capacitor 320. Since the amount of a current provided to the source of the PMOS transistor CP varies according to the number of turned-on transistors among PMOS transistors $P_0, \ldots P_m$ included in the current controller 310, the resistance between the power source VCC and the source of the PMOS transistor CP can be regulated. As a result, an RC delay time is regulated with the delay capacitor 320. Thus, this embodiment comprises an RC delay time characteristic parameter controller that controls the output signal delay by activating a number of registers in the register array 541 via the register command processor 542.

Figure 10B:
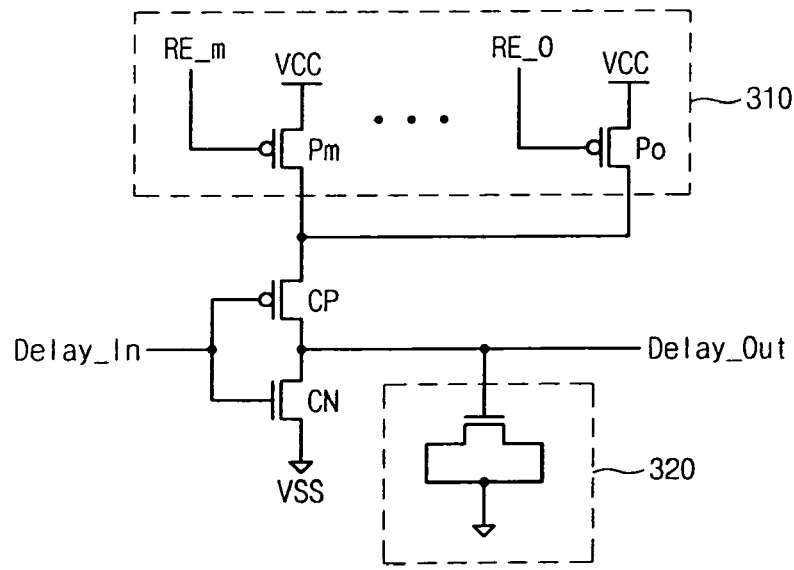

FIG. 10b shows a second example embodiment of the timing controller 300. Unlike FIG. 10a, the delay capacitor 320 is connected between ground and the drain of the NMOS transistor CN. The operational principle is the same as that of FIG. 10a described above. Similarly, this embodiment comprises an RC delay time characteristic parameter controller that controls the output signal delay by activating a number of registers in the register array 541 via the register command processor 542.

Figure 11:
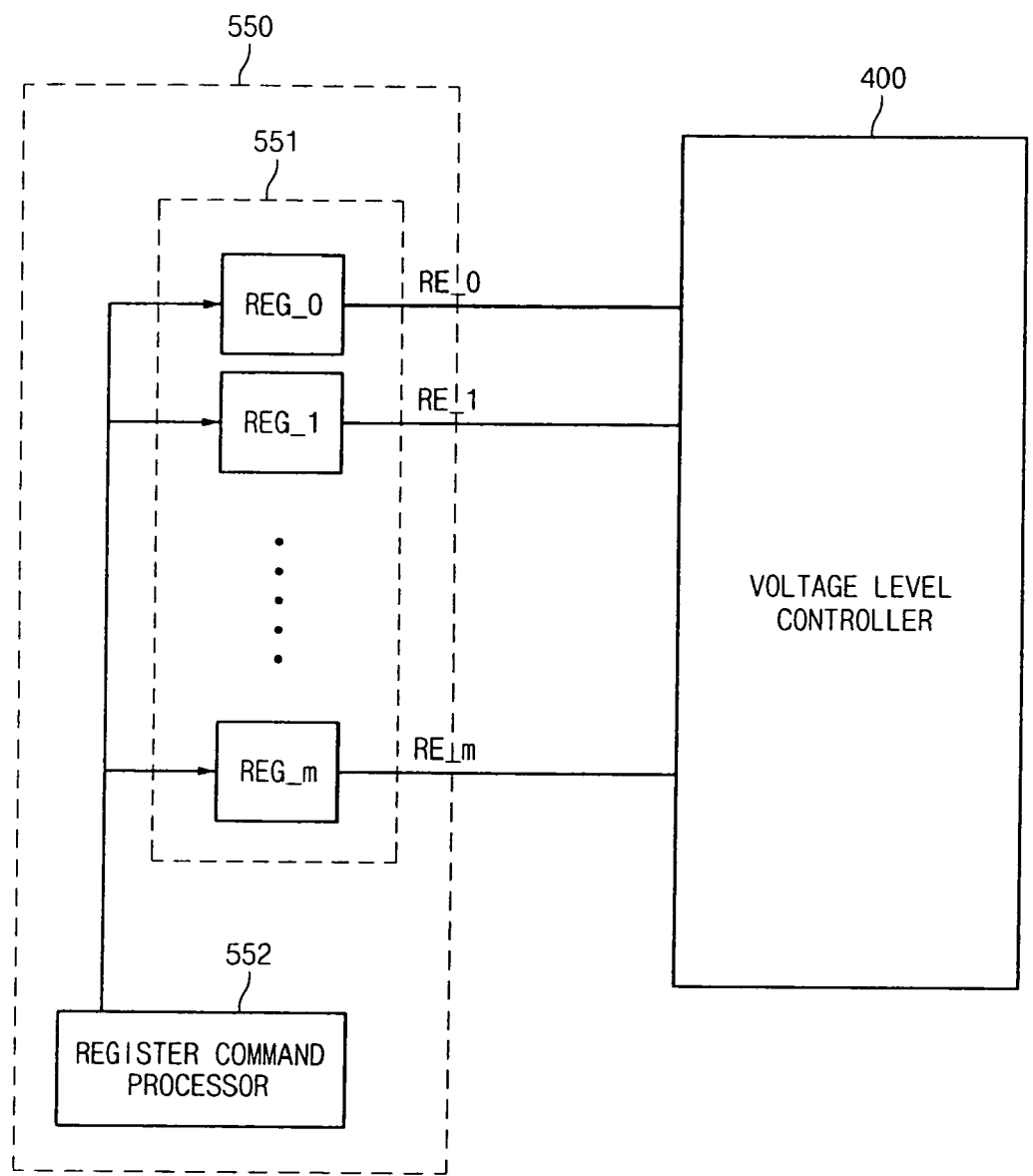
FIG. 11 is a structural diagram showing a fifth register controller and a voltage level controller of FIG. 1.

FIG. 11 is a structural diagram showing the voltage level controller 400 and the fifth register controller 550 of FIG. 1, which includes register array 551 and register command processor 552. The detailed explanation on the fifth register controller 550 is omitted because it works the same as the first register controller 510 does.

Figure 12A:
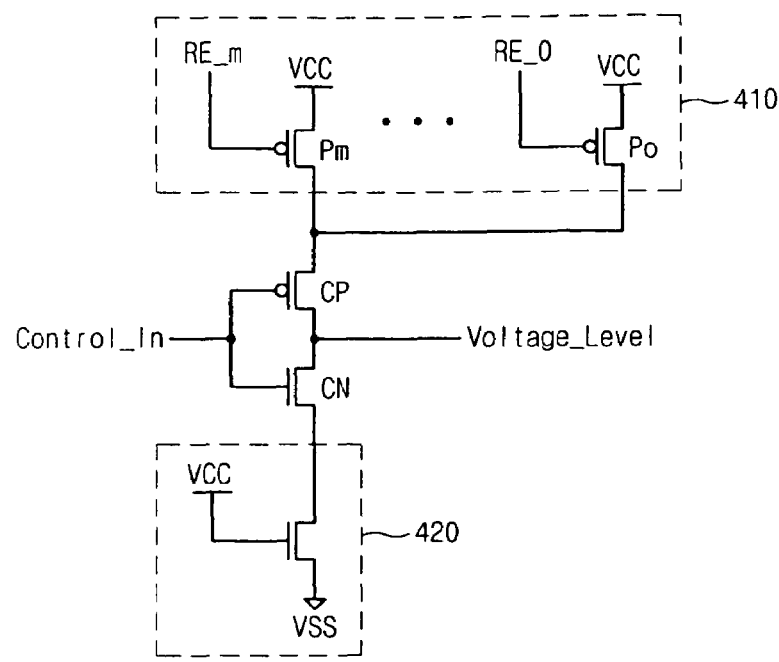
FIGS. 12a through 12c are structural diagrams showing the voltage level controller of FIG. 11.

FIG. 12a shows a first example embodiment of the voltage level controller 400. The voltage level controller 400 comprises a current controller 410, a PMOS transistor CP, a NMOS transistor CN and a NMOS transistor 420. The current controller 410 comprises a plurality of PMOS transistors $P_0, \ldots P_m$ having gates to receive outputs RE_0, ... RE_m and sources connected to the power source VCC. The PMOS transistor CP has a source connected to drains of the PMOS transistors $P_0, \ldots P_m$. The NMOS transistor CN has a drain connected to a drain of the PMOS transistor CP. The NMOS transistor 420 has a gate connected to the power source VCC, a source connected to ground, and a drain connected to a source of the NMOS transistor CN.

A control signal Control_In is inputted to a gate of the PMOS transistor CP and the NMOS transistor CN. A voltage Voltage_Level is outputted from the drain of the PMOS transistor CP.

The amount of current flowing in the source of the PMOS transistor CP varies according to the number of turned-on transistors among the PMOS transistors $P_0, \ldots P_m$ included in the current controller 410. As a result, the value of the outputted voltage Voltage_Level varies according to the amount of the current. Thus, this embodiment comprises an output voltage characteristic parameter controller that controls the output signal voltage by activating a number of registers in the register array 551 via a register command processor 552.

Figure 12B:
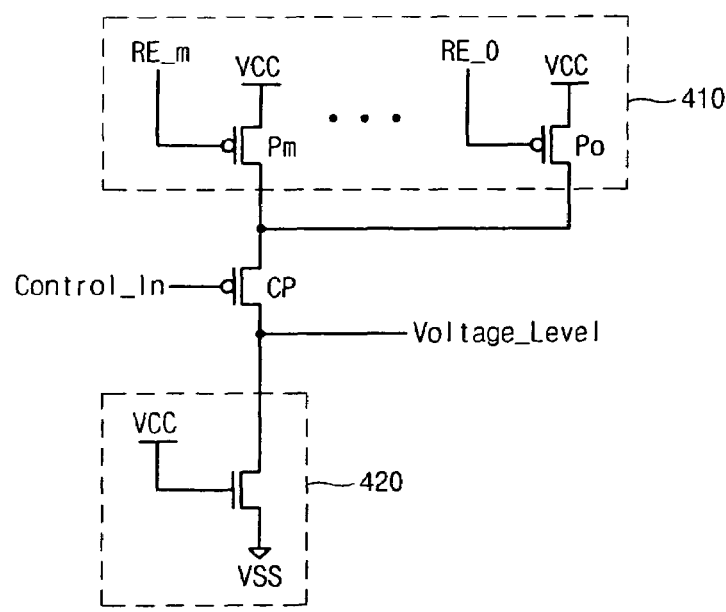

FIG. 12b shows a second example embodiment of the voltage level controller 400. In the second example embodiment, the NMOS transistor CN of FIG. 12a is not used. The drain of the NMOS transistor 420 is connected to the drain of the PMOS transistor CP. The voltage Voltage_Level is outputted from the drain of the PMOS transistor CP. The explanation of the other operation is omitted because it is the same as that of the first example embodiment. Similarly, this embodiment comprises an output voltage characteristic parameter controller that controls the output signal voltage by activating a number of registers in the register array 551 via a register command processor 552.

Figure 12C:
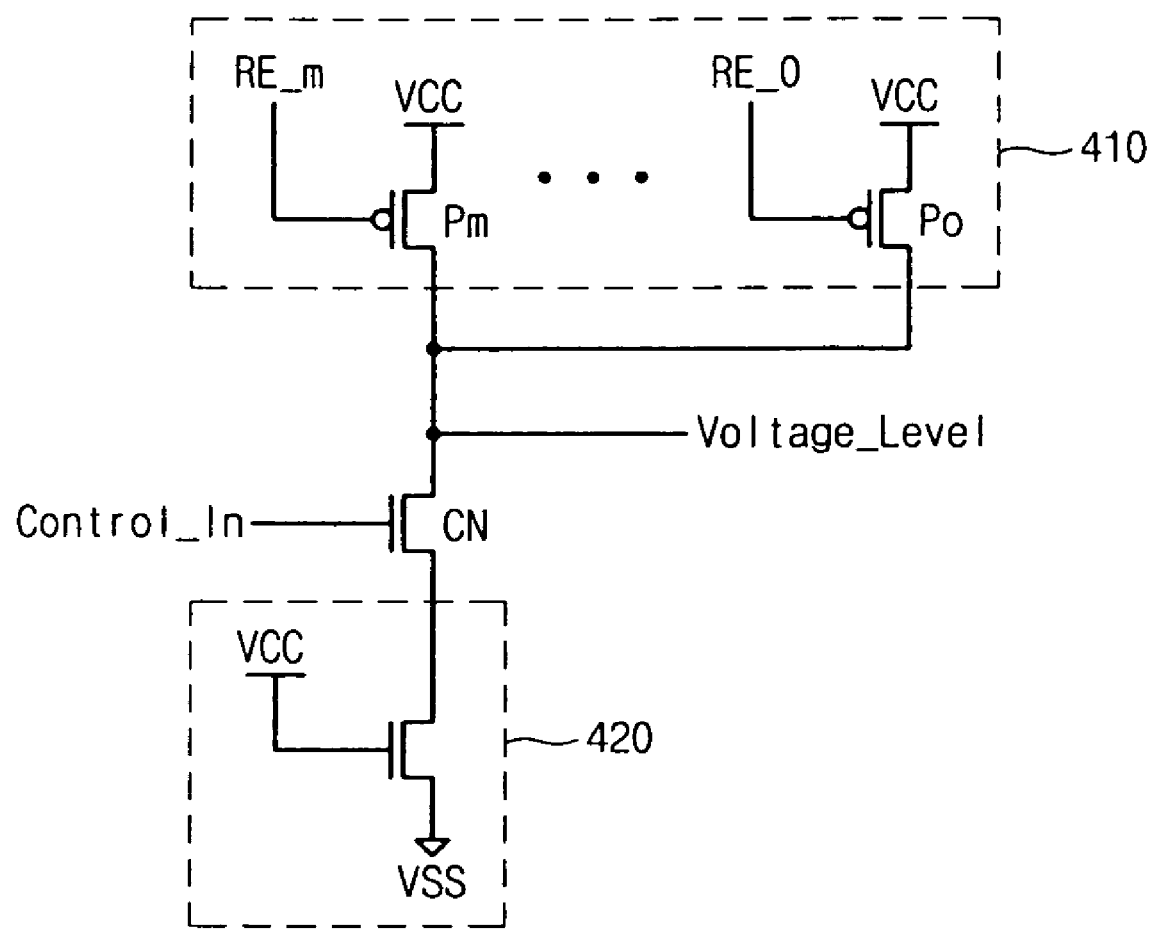

FIG. 12c shows a third example embodiment of the voltage level controller 400. In the third example embodiment, the PMOS transistor CP of FIG. 12a is not used. The drain of the NMOS transistor CN is connected to the drains of the PMOS transistors $P_0, \ldots P_m$. The voltage Voltage_Level is outputted from the drain of the NMOS transistor CN. The explanation of the other operation is omitted because it is the same as that of the first example embodiment. Similarly, this embodiment comprises an output voltage characteristic parameter controller that controls the output signal voltage by activating a number of registers in the register array 551 via a register command processor 552.

Figure 13:
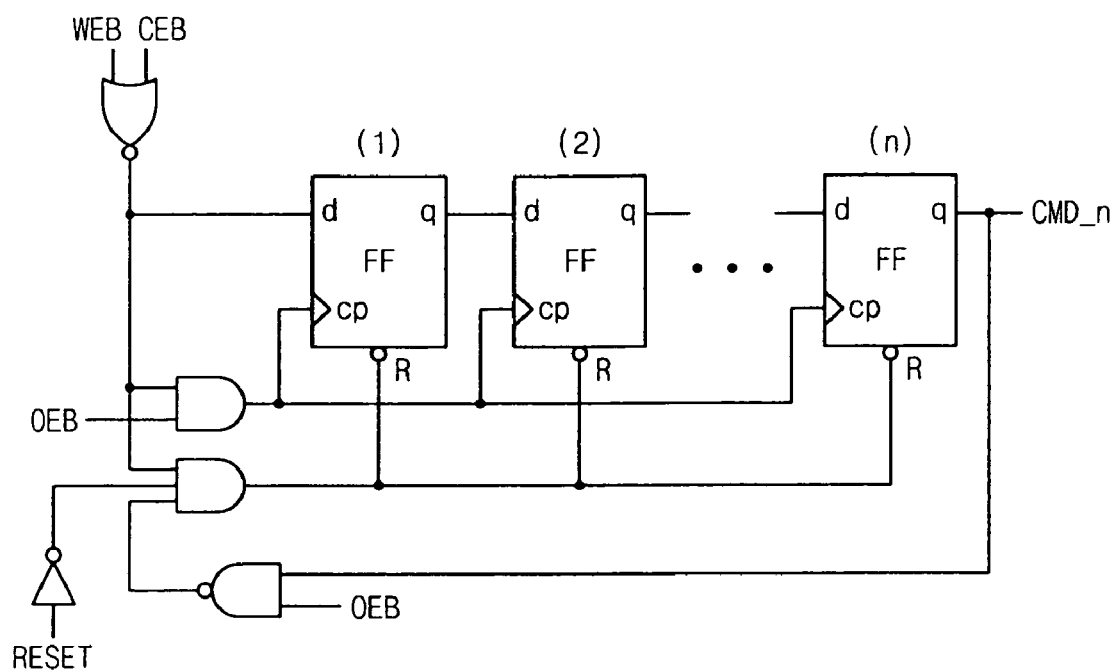
FIG. 13 is a structural diagram showing a register command processor included in a memory device according to the present invention.

FIG. 13 is a structural diagram showing an embodiment of the register command processor included in the register controller. The register command processor decodes a chip enable signal CEB, a write enable signal WEB and an output enable signal OEB, and then outputs a command signal CMD_n for starting a program mode.

It is noted that in the foregoing description, the use of different reference numbers in the figures and in the text to refer to similar structures is not intended to imply that the structures are necessarily distinct. For example, the register command processor, which is referred to as 512, 542 and 552, may be configured as a single structure connected to all or some of the registers.

Figure 14A:
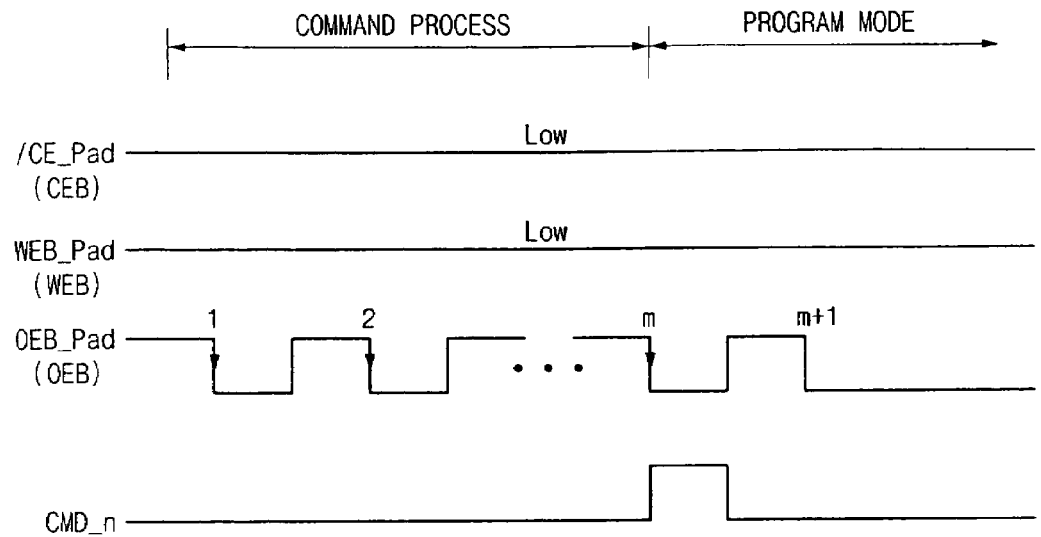
FIGS. 14a and 14b are timing diagrams showing a program mode decoding operation according to the present invention.
Figure 14B:
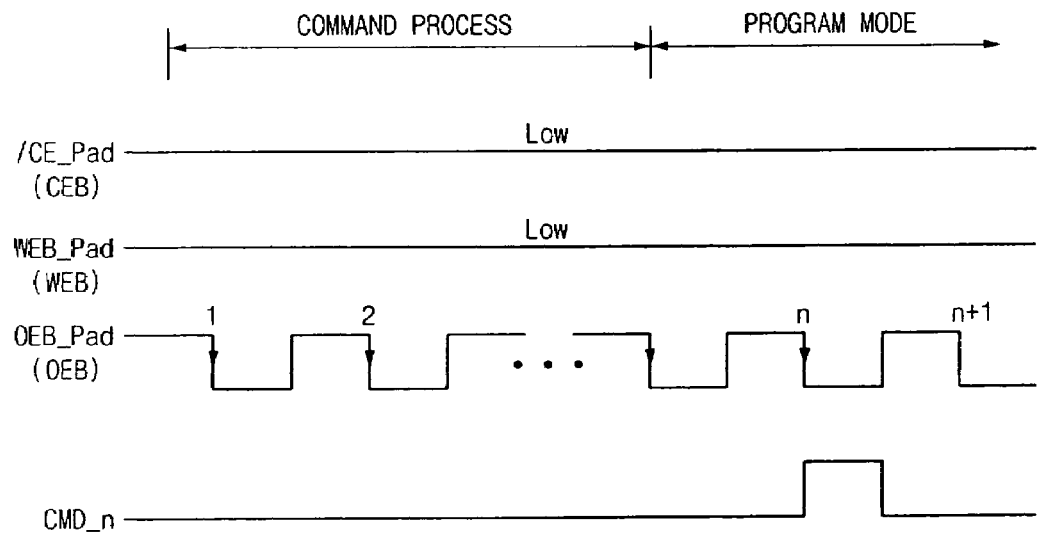

FIGS. 14a and 14b are timing diagrams showing the operation of the register command processor according to an embodiment of the present invention. The operation of the register command processor of FIG. 13 is explained referring to FIG. 14a.

If the write enable signal WEB and the chip enable signal CEB are activated to "low" levels, toggling of the output enable signal OEB is provided to a clock input of a D flip-flop. Since there are n D flip-flops, if the output enable signal OEB toggles n-times, an output having a "high" level in a NOR gate is outputted from the $n^{th}$ flip-flop, and then the control signal CMD_n becomes activated. However, while the output signal CMD_n is activated, if the output enable signal OEB becomes "high", then all the D flip-flops become reset. As a result, the output signal CMD_n becomes "low". That is, the output signal CMD_n is activated at a $n^{th}$ falling edge of the output enable signal OEB, and inactivated when the output enable signal OEB rises to a high level.

Figure 15:
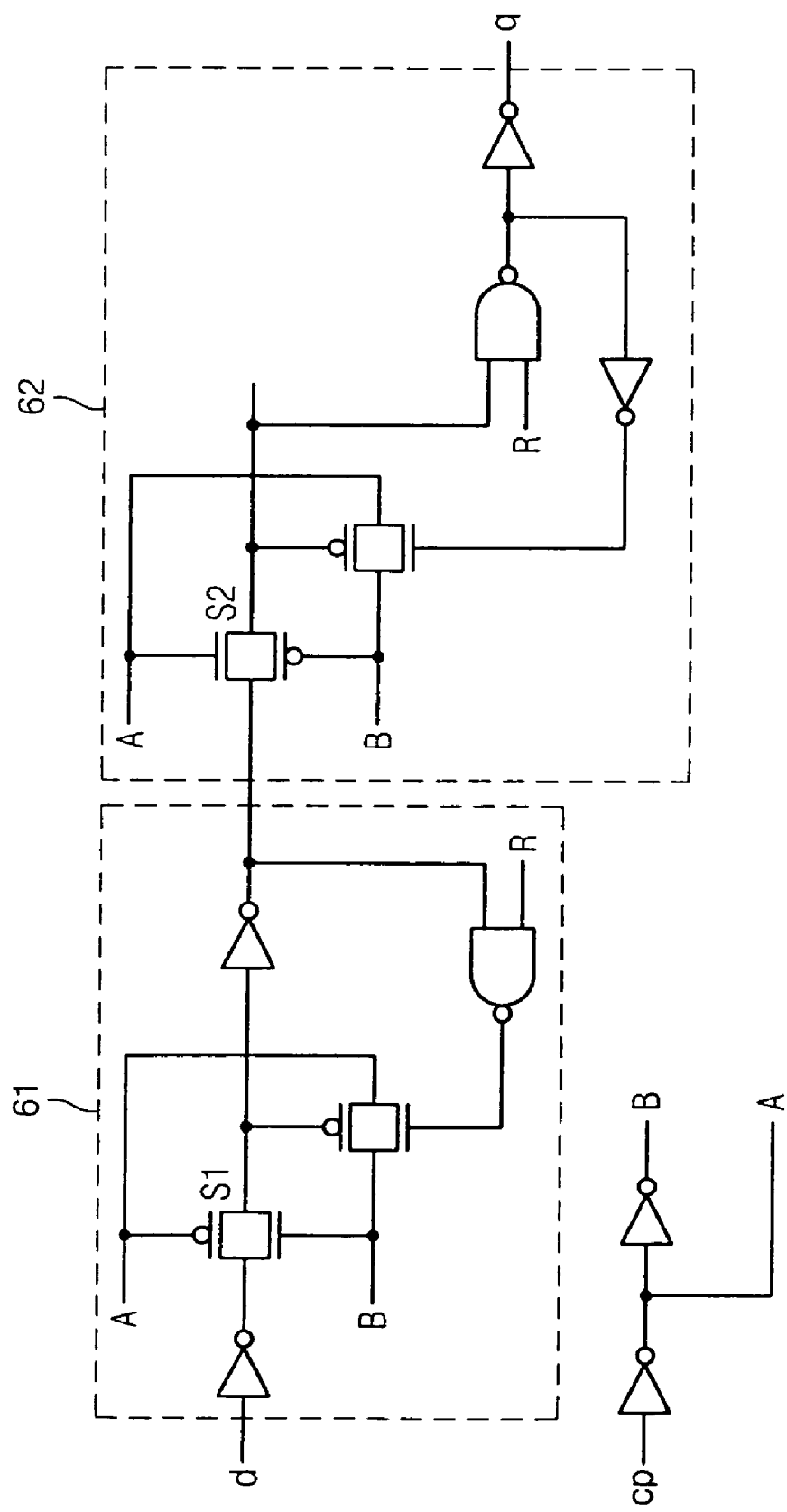
FIG. 15 is a structural diagram showing a D flip-flop of FIG. 13.

FIG. 15 is a structural diagram showing the D flip-flop used in the program command processor FIG. 13. In general, a D flip-flop is a circuit for sampling and outputting a signal provided to an input terminal at an edge of a clock signal. The circuit samples an input signal d at the falling edge of the clock CP. The switch S1 of the master unit 61 is opened, and stores the input signal d in a latch when the clock is at a "high" level. Here, since a switch S2 of a slave unit 62 is closed, the input signal d is not transmitted into a latch of the slave unit 62. If the clock CP is transited to a "low" level, the switch S1 of the master unit 61 is closed, and the switch S2 of the slave unit 62 is opened. As a result, data stored in the latch of the master unit 61 is stored in the latch of the slave unit 62, and the signal stored in the latch of the slave unit 62 is continuously outputted to a next falling edge of the clock.

Figure 16:
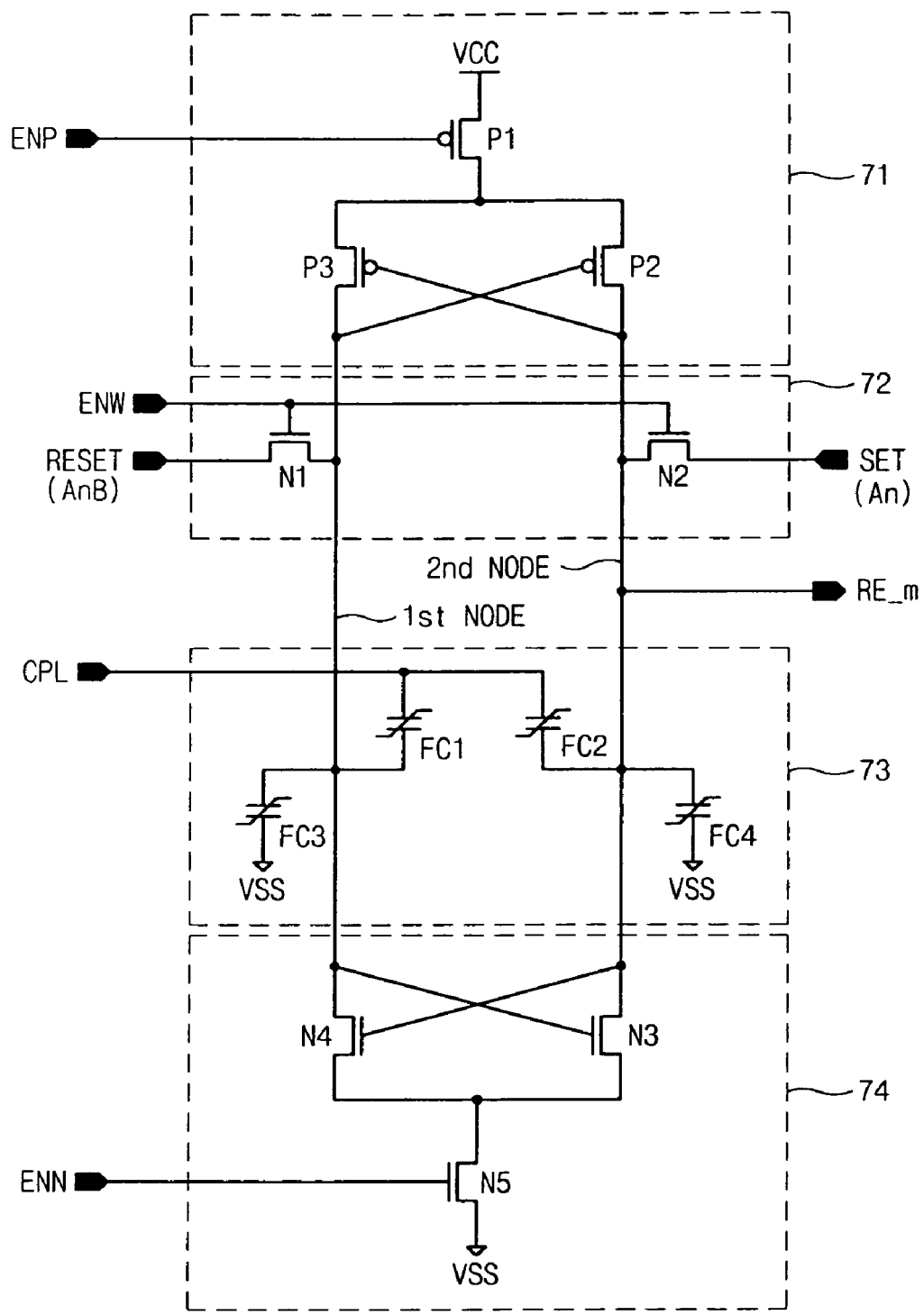
FIG. 16 is a structural diagram showing a register included in a memory device according to the present invention.

FIG. 16 is a structural diagram showing the register included in the register array according to the present invention. The register comprises a first amplifier 71, an input unit 72, a storage unit 73 and a second amplifier 74.

The first amplifier 71 comprises PMOS transistors P1, P2 and P3. The PMOS transistor P1 has a gate to receive a first control signal ENP, and a source connected to a positive power source VCC. The PMOS transistor P2 has a gate connected to a first node, a source connected to a drain of the PMOS transistor P1, and a drain connected to a second node. The PMOS transistor P3 has a gate connected to the second node, a source connected to the drain of the PMOS transistor P1, and a drain connected to the first node.

The second amplifier 74 comprises NMOS transistors N3, N4 and N5. The NMOS transistor N3 has a gate connected to a first node, and a drain connected to a second node. The NMOS transistor N4 has a gate connected to the second node, and a drain connected to the first node. The NMOS transistor N5 has a gate to receive a second control signal ENN, a drain connected to a source of the NMOS transistor N3 and a source of the NMOS transistor N4, and a source connected to ground VSS.

The input unit 72 comprises NMOS transistors N1 and N2. The NMOS transistor N1 has a gate to receive a third control signal ENW, a source to receive a data signal RESET(AnB), and a drain connected to the first node. The NMOS transistor N2 has a gate to receive the third control signal ENW, a source to receive a data signal SET(An), and a drain connected to the second node.

The storage unit 73 comprises ferroelectric capacitors FC1, FC2, FC3 and FC4. The ferroelectric capacitor FC1 is connected between a fourth control signal CPL and the first node. The ferroelectric capacitor FC2 is connected between the fourth control signal CPL and the second node. The ferroelectric capacitor FC3 is connected between the first node and ground VSS. The ferroelectric capacitor FC4 is connected between the second node and ground VSS.

When the control signal ENP is "low" and the control signal ENN is "high", the first amplifier 71 and the second amplifier 74 fix these signals, respectively, at VCC and VSS. When the control signal ENP is "high" and the control signal ENN is "low", the register is disconnected from the power source, and does not operate.

When the control signal ENW is "high", the input unit 72 provides data signals SET and RESET, respectively, to the second node and the first node. When the control signal ENW is "low", the first node and the second node are disconnected from the data signals SET and RESET.

The storage unit 73 stores data signals provided to the first node and the second node in the ferroelectric capacitors FC1, FC2, FC3 and FC4 by regulating the control signal CPL.

The output signal RE_m is outputted from the second node. The operation of the register is explained hereinafter.

Figure 17A:
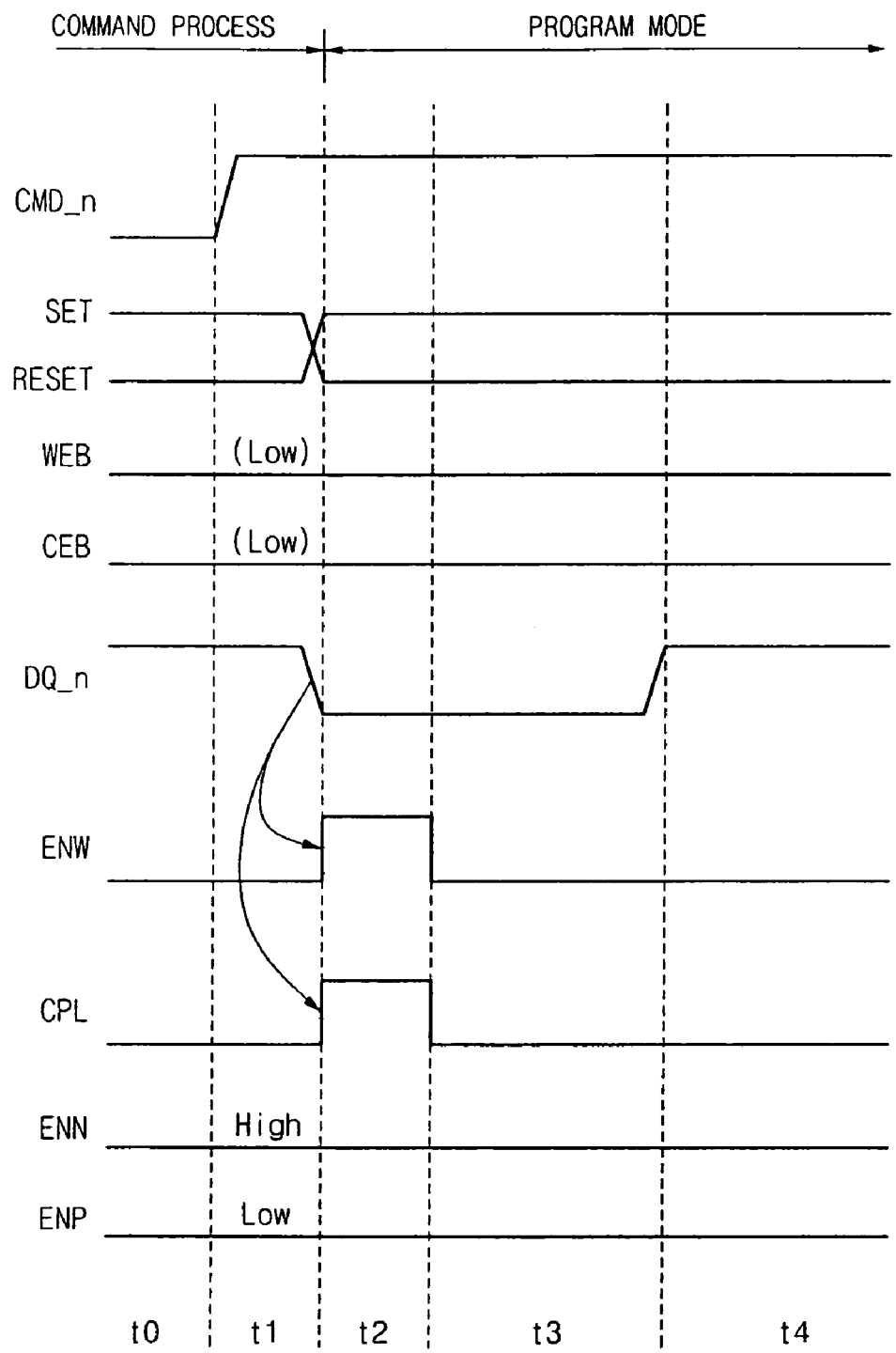
FIGS. 17a through 17b are timing diagrams illustrating write/read operation respectively.

FIG. 17a is a timing diagram showing the process of storing new data into the register when the program command signal CMD_n is activated. If the program command signal CMD_n is activated, the register command processor 520 is inactivated until the program process is finished. As a result, new data is not inputted into the register while the writing operation is performed in the register.

In t1, the program command signal CMD_n is activated. In t2, if a data signal DQ_n provided from the data I/O pad transits from "high" to "low", the control signal ENW is activated and the data signals SET and RESET are provided, respectively, to the second node and the first node. The DQ_n signal is used with the CMD_n signal to generate a pulse signal (see FIG. 18). If the signal CPL becomes "high", signals are stored in the ferroelectric capacitors FC1 through FC4 according to the voltages of the first node and the second node. For example, when the first node is "low", and the second node is "high", charges are stored in the ferroelectric capacitors FC1 and FC4.

In t3, if the control signal ENW is "low", the data signals SET and RESET are separated from the first node and the second node. The voltages of the first node and the second node are amplified by the first amplifier 71 and the second amplifier 74, and maintained. If the control signal CPL becomes "low", charges are re-distributed between the ferroelectric capacitors FC1 and FC3, and between the ferroelectric capacitors FC2 and FC4. Here, the voltages of the first node and the second node vary also. The voltage of the second node becomes higher than that of the first node. The ferroelectric capacitors FC1 through FC4 maintain the stored charges even when the power source is turned off. In t4, if the signals DQ_n becomes "high", the program mode is finished.

Figure 17B:
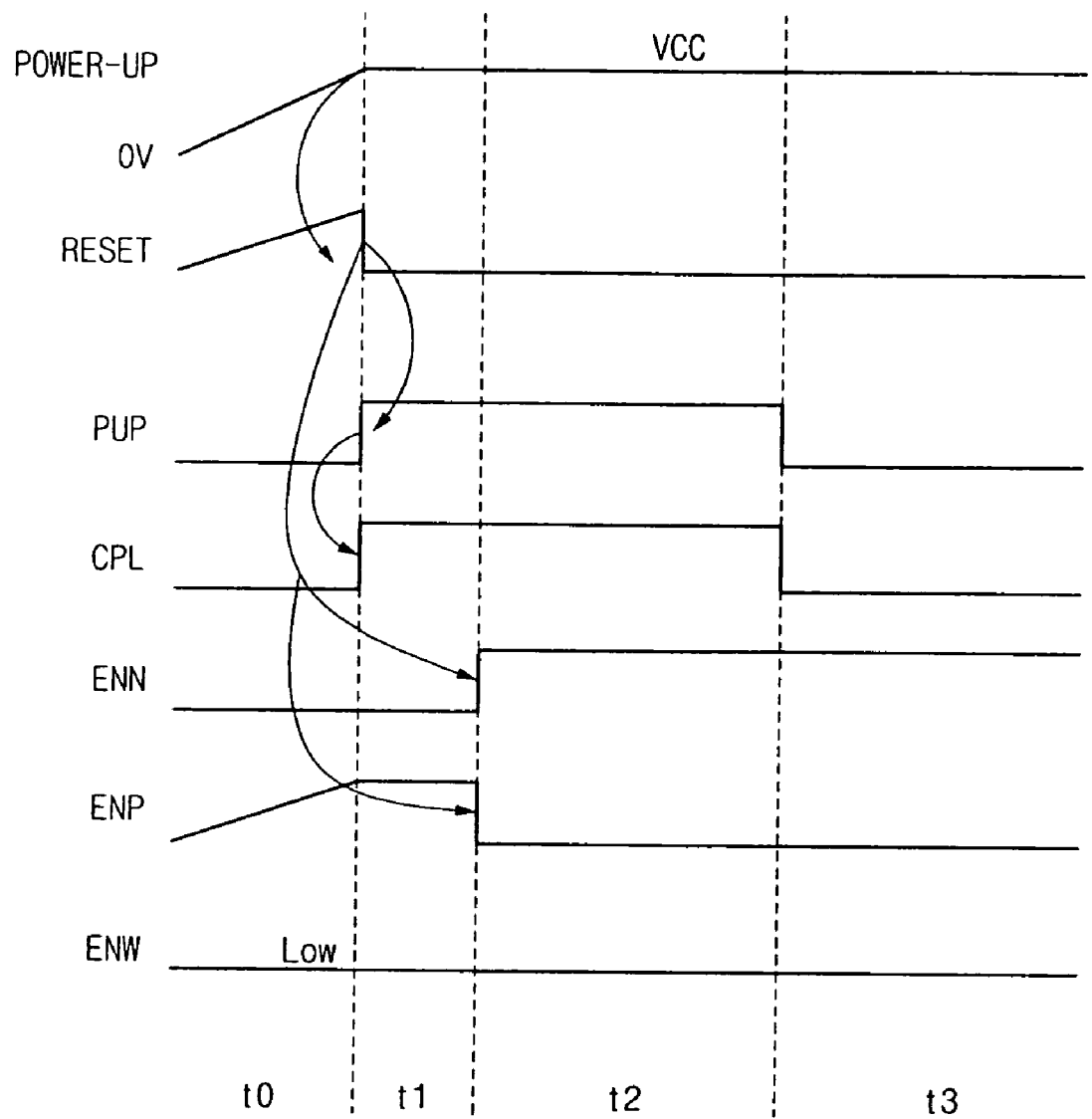

FIG. 17b is a timing diagram showing the process of reading a signal stored in the register when the power source is initially provided to the memory device.

In t1, if the power source reaches a stable level, a power-up detection signal PUP becomes "high". If the control signal CPL is transited to a "high" level by using the signal PUP, the charges stored in the ferroelectric capacitors FC1 and FC2 of FIG. 16 generate voltage differences in the first node and the second node.

In t2, if the sufficient voltage difference is generated, the control signals ENN and ENP are activated, respectively, to "high" and "low". As a result, the data of the first node and the second node are amplified.

After the amplification of the data is completed, the control signal CPL transits to "low" in t3. As a result, the "high" data destroyed during t1 is restored. Here, the control signal ENW is inactivated to "low", and the data signals SET and RESET are not provided to the second node and the first node.

Figure 18:
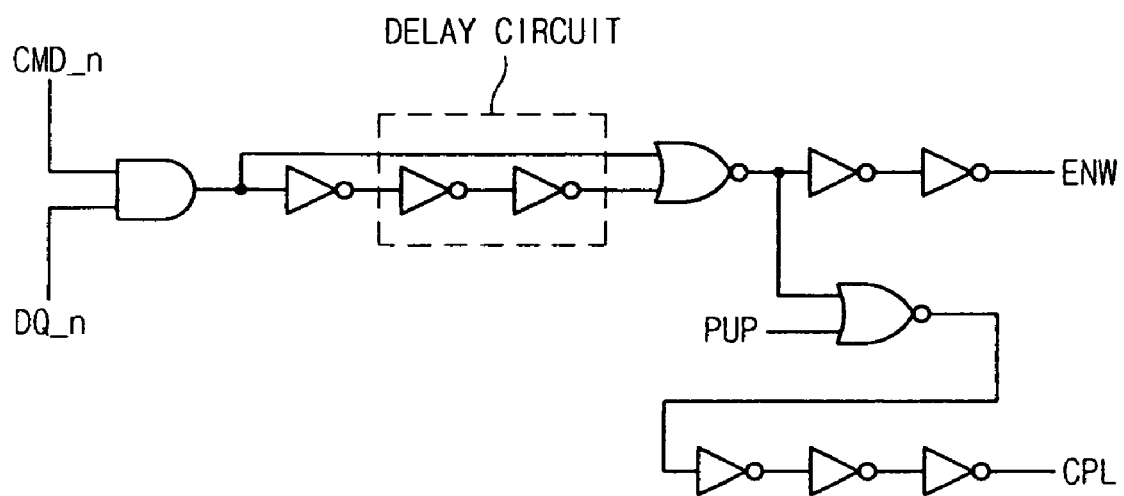
FIG. 18 is a circuit diagram showing the register of FIG. 16 for outputting a register control signal of FIG. 16.

FIG. 18 is a circuit diagram showing the register for outputting the control signals ENW and CPL. The control signal PUP is used to read data stored in the register after the initial reset, and then to restore the read data. After the program command signal CMD_n is activated, if the signal DQ_n transits from "high" to "low", the control signals ENW and CPL having a pulse width corresponding to the delay time of the delay circuit are generated (see FIG. 17a).

As discussed earlier, in the memory device of the present invention, it is unnecessary to change a mask for final production because the characteristic parameters of the memory device can be controlled in a package. As a result, cost and time required to develop a memory device can be remarkably improved.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A memory device capable of controlling a characteristic parameter, comprising:
   a first register controller comprising a nonvolatile memory unit configured to store data;
   a first current controller configured to output an amount of current that is controlled according to a signal outputted from the first register controller;
   a signal processor configured to receive an external signal, and change and output a voltage level of the received external signal according to the amount of current outputted from the first current controller, wherein the signal processor comprises a voltage fixing means for receiving a control signal and for fixing a signal outputted from the signal processor at a predetermined voltage level regardless of the external signal when the control signal is inactivated; and
   a buffer configured to receive a signal outputted from the signal processor.

2. The memory device according to claim 1, wherein the external signal received by the signal processor is one of an address signal, a data signal and a control signal.

3. The memory device according to claim 1, wherein the signal processor comprises:
   a second register controller comprising a nonvolatile memory unit configured to store data;
   a second current controller configured to control an amount of current that is controlled according to a signal outputted from the second register controller;
   a capacitor connected between an output terminal of the second current controller and ground; and
   a delay controller configured to delay the external signal for a predetermined time according to the amount of current outputted from the second current controller and a capacitance of the capacitor, and output the delayed signal.

4. A memory device capable of controlling a characteristic parameter, comprising:
   a register controller comprising a nonvolatile memory unit and configured to output a plurality of signals;
   a current controller configured to control an amount of current outputted according to the plurality of signals outputted from the register controller; and
   a delay controller configured to delay an externally inputted signal for a predetermined time according to the amount of current outputted from the current controller and a capacitance of a capacitor connected between an output terminal and a ground, and output the delayed signal.

5. A memory device capable of controlling a characteristic parameter, comprising:
   a register controller comprising a nonvolatile memory unit and configured to output a plurality of signals;
   a current controller configured to control an amount of current outputted according to the plurality of signals outputted from the register controller;
   a current fixer comprising a first end and a second end and configured to fix the an amount of current flowing through both ends; and
   a voltage generator connected between the current controller and the current fixer, and configured to output a predetermined voltage according to an externally inputted control signal, the amount of current outputted from the current controller, and the amount of current flowing through the current fixer.

6. The memory device according to claim 4, wherein the current controller comprises a plurality of PMOS transistors each comprising a gate, a drain and a source, wherein for each of the plurality of PMOS transistors the gate is connected to receive one of the plurality of signals outputted from the register controller, the source is connected to a common positive power source, and the drain is connected to a common current output.

7. The memory device according to claim 5, wherein the current controller comprises a plurality of PMOS transistors each comprising a gate, a drain and a source, wherein for each of the plurality of PMOS transistors the gate is connected to receive one of the plurality of signals outputted from the register controller, the source is connected to a common positive power source, and the drain is connected to a common current output.

* * * * *